(12) United States Patent
Yamashita et al.

(10) Patent No.: US 10,704,148 B2
(45) Date of Patent: Jul. 7, 2020

(54) LAMINATED FILM AND FLEXIBLE ELECTRONIC DEVICE

(71) Applicant: SUMITOMO CHEMICAL COMPANY, LIMITED, Tokyo (JP)

(72) Inventors: Yasuhiro Yamashita, Tsukuba (JP); Yutaka Ito, Tsukuba (JP); Hideaki Nakajima, Ichihara (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 15/107,518

(22) PCT Filed: Dec. 11, 2014

(86) PCT No.: PCT/JP2014/083497
§ 371 (c)(1),
(2) Date: Jun. 23, 2016

(87) PCT Pub. No.: WO2015/098672
PCT Pub. Date: Jul. 2, 2015

(65) Prior Publication Data
US 2016/0312362 A1  Oct. 27, 2016

(30) Foreign Application Priority Data
Dec. 26, 2013 (JP) ................ 2013-268641

(51) Int. Cl.
*C23C 16/50* (2006.01)
*C23C 16/30* (2006.01)
(Continued)

(52) U.S. Cl.
CPC ............ *C23C 16/50* (2013.01); *C23C 16/308* (2013.01); *C23C 16/325* (2013.01);
(Continued)

(58) Field of Classification Search
CPC ..... C23C 16/50; C23C 16/545; C23C 16/325; C23C 16/345; C23C 16/507; C23C 16/308; H05K 1/028; H01B 1/04
See application file for complete search history.

(56) References Cited

U.S. PATENT DOCUMENTS

2006/0226517 A1  10/2006  Iwanaga et al.
2007/0026243 A1  2/2007  Iwanaga et al.
(Continued)

FOREIGN PATENT DOCUMENTS

JP  2005219427 A  8/2005
JP  2006263989 A  10/2006
(Continued)

OTHER PUBLICATIONS

Machine english translation of Osamu et al. (JP 2007-152772) retrieved from the espace website Oct. 30, 2017.*
(Continued)

*Primary Examiner* — Jonathan C Langman
(74) *Attorney, Agent, or Firm* — Sughrue Mion, PLLC

(57) ABSTRACT

A laminated film includes a flexible base material, a first thin film layer formed on at least one of surfaces of the base material, and a second thin film layer formed on the first thin film layer, and the first thin film layer contains a silicon atom (Si), an oxygen atom (O) and a carbon atom (C), the second thin film layer contains a silicon atom, an oxygen atom and a nitrogen atom (N), and the first thin film layer and the second thin film layer are formed by using glow discharge plasma.

15 Claims, 2 Drawing Sheets

(51) Int. Cl.
  C23C 16/32    (2006.01)
  C23C 16/34    (2006.01)
  C23C 16/507   (2006.01)
  C23C 16/54    (2006.01)
  H01B 1/04     (2006.01)
  H05K 1/02     (2006.01)

(52) U.S. Cl.
  CPC .......... *C23C 16/345* (2013.01); *C23C 16/507* (2013.01); *C23C 16/545* (2013.01); *H01B 1/04* (2013.01); *H05K 1/028* (2013.01)

(56) References Cited

U.S. PATENT DOCUMENTS

| | | | |
|---|---|---|---|
| 2007/0224430 A1* | 9/2007 | Iwanaga | C23C 14/0676 428/446 |
| 2011/0262679 A1 | 10/2011 | Azuma et al. | |
| 2012/0040107 A1* | 2/2012 | Hasegawa | C23C 16/401 428/1.1 |
| 2013/0244079 A1 | 9/2013 | Mandlik et al. | |
| 2013/0269610 A1 | 10/2013 | Tamagaki et al. | |
| 2015/0364720 A1* | 12/2015 | Itoh | B32B 27/06 428/446 |

FOREIGN PATENT DOCUMENTS

| | | | | |
|---|---|---|---|---|
| JP | 200715350 A | 1/2007 | | |
| JP | 2007-152772 A | 6/2007 | | |
| JP | 2011231357 A | 11/2011 | | |
| JP | 201281633 A | 4/2012 | | |
| JP | 201282467 A | 4/2012 | | |
| JP | 201282468 A | 4/2012 | | |
| JP | 2012179763 A | 9/2012 | | |
| JP | 2013234365 A | 11/2013 | | |
| JP | WO-2014-119750 | * | 8/2014 | ............... B32B 9/00 |
| WO | 2012081171 A1 | 6/2012 | | |
| WO | 2013146964 A1 | 10/2013 | | |
| WO | 2013161785 A1 | 10/2013 | | |

OTHER PUBLICATIONS

International Preliminary Report on Patentability issued from the International Bureau in counterpart International Application No. PCT/JP2014/083497, dated Jun. 28, 2016.

International Search Report, issued by International Searching Authority in corresponding International Application No. PCT/JP2014/083497, dated Mar. 31, 2015.

Communication dated Jan. 24, 2017 from the State Intellectual Property Office of the P.R.C. in counterpart Application No. 201480070996.1.

Communication dated Mar. 21, 2018, from the Intellectual Property Office of Taiwan in counterpart application No. 103144078.

* cited by examiner

LAMINATED FILM AND FLEXIBLE ELECTRONIC DEVICE

CROSS REFERENCE TO RELATED APPLICATIONS

This application is a National Stage of International Application No. PCT/JP2014/083497 filed Dec. 11, 2014, claiming priority based on Japanese Patent Application No. 2013-268641 filed Dec. 26, 2013, the contents of all of which are incorporated herein by reference in their entirety.

TECHNICAL FIELD

The present invention relates to a laminated film and a flexible electronic device.

BACKGROUND ART

A laminated film in which a thin film layer is formed (laminated) on a surface of a film-like base material in order to impart functionality to the base material is known. For example, a laminated film to which a gas barrier property is imparted by forming a thin film layer on a plastic film is suited for filling and packaging of articles such as foods and beverages, cosmetics, and detergents. In recent years, a laminated film in which a thin film of an inorganic oxide such as silicon oxide, silicon nitride, silicon oxynitride, and aluminum oxide is formed on one of surfaces of a base material film such as a plastic film has been proposed.

As a method for forming a thin film of an inorganic oxide on a surface of a plastic base material, deposition methods including physical vapor deposition (PVD) methods such as a vacuum evaporation method, a sputtering method, and an ion plating method, and chemical vapor deposition (CVD) methods such as a low pressure chemical vapor deposition method and a plasma chemical vapor deposition method are known.

Then, Patent Document 1 and Patent Document 2 each disclose a gas barrier laminated film in which a thin film layer of silicon nitride or silicon carbon oxynitride is formed by the aforementioned methods.

PRIOR ART DOCUMENTS

Patent Documents

Patent Document 1: JP-A-2011-231357
Patent Document 2: JP-A-2005-219427

SUMMARY OF THE INVENTION

Problems to be Solved by the Invention

However, the gas barrier laminated film has a problem of strong yellowish tone due to the influence of an enhanced gas barrier property. Moreover, adhesiveness between the base material and the thin film layer can reduce, and optical characteristics and an adhesion property have been insufficient.

The present invention has been devised in light of the above-described circumstances, and it is an object of the present invention to provide a gas barrier laminated film having excellent optical characteristics and an excellent adhesion property.

Means for Solving the Problems

In order to solve the problem, the present invention provides a laminated film including
a flexible base material,
a first thin film layer formed on at least one of surfaces of the base material, and
a second thin film layer formed on the first thin film layer, and
the first thin film layer contains a silicon atom (Si), an oxygen atom (O) and a carbon atom (C), the second thin film layer contains a silicon atom, an oxygen atom and a nitrogen atom (N), and
the first thin film layer and the second thin film layer are formed by using glow discharge plasma.

In the laminated film of the present invention, preferably, in a silicon distribution curve, an oxygen distribution curve, and a carbon distribution curve respectively showing a relationship between a distance from a surface of the first thin film layer in a thickness direction of the first thin film layer and a ratio of number of silicon atoms (atomic number ratio of silicon), a ratio of number of oxygen atoms (atomic number ratio of oxygen), and a ratio of number of carbon atoms (atomic number ratio of carbon), relative to a total number of the silicon atoms, the oxygen atoms and the carbon atoms contained in the first thin film layer at a point situated at the distance, the laminated film satisfies all of the following conditions (i) to (iii):

(i) the atomic number ratio of silicon, the atomic number ratio of oxygen and the atomic number ratio of carbon satisfy a condition represented by the following formula (1) in a region of 90% or more in the thickness direction of the first thin film layer:

(Atomic number ratio of oxygen)>(Atomic number ratio of silicon)>(Atomic number ratio of carbon)  (1)

(ii) the carbon distribution curve has at least one extreme, and (iii) an absolute value of a difference between a maximum value and a minimum value of the atomic number ratio of carbon in the carbon distribution curve is 0.05 or more.

In the laminated film of the present invention, preferably, when X-ray photoelectron spectrometry is conducted for a surface of the second thin film layer, an atomic number ratio of carbon atoms to silicon atoms calculated from a wide scan spectrum falls within the range represented by the following formula (2):

$0 < C/Si \leq 0.2$  (2).

In the laminated film of the present invention, preferably, a thickness of the second thin film layer is 80 nm or more, and silicon atoms and oxygen atoms are contained in a depth range up to 40 nm in the thickness direction toward inside the second thin film layer from a surface of the second thin film layer, and an atomic number ratio of nitrogen atoms to silicon atoms falls within the range represented by the following formula (3):

$N/Si \leq 0.2$  (3).

In the laminated film of the present invention, preferably, a thickness of the second thin film layer is 80 nm or more, and silicon atoms and oxygen atoms are contained in a depth range up to 40 nm in the thickness direction toward inside the second thin film layer from an interface between the second thin film layer and the first thin film layer, and an atomic number ratio of nitrogen atoms to silicon atoms falls within the range represented by the following formula (4):

$N/Si \leq 0.2$  (4).

In the laminated film of the present invention, preferably, when infrared spectrometry is conducted for the second thin film layer, an intensity ratio between a peak intensity (I) existing between 810 and 880 cm$^{-1}$ and a peak intensity (I') existing between 2100 and 2200 cm$^{-1}$ falls within the range represented by the following formula (5):

$$0.05 \leq I'/I \leq 0.20 \tag{4}.$$

In the laminated film of the present invention, preferably, the first thin film layer and the second thin film layer are formed by a plasma CVD method.

In the laminated film of the present invention, preferably, the second thin film layer is formed by an inductively-coupled plasma CVD method.

A flexible electronic device using the laminated film of the present invention as a substrate is preferred.

Effect of the Invention

According to the present invention, it is possible to provide a gas barrier laminated film having excellent optical characteristics and an excellent adhesion property. The laminated film of the present invention also has excellent flexibility. The laminated film of the present invention can be used as a substrate of a flexible electronic device, and is industrially very useful.

MODE FOR CARRYING OUT THE INVENTION

[Laminated Film]

Figure 1:
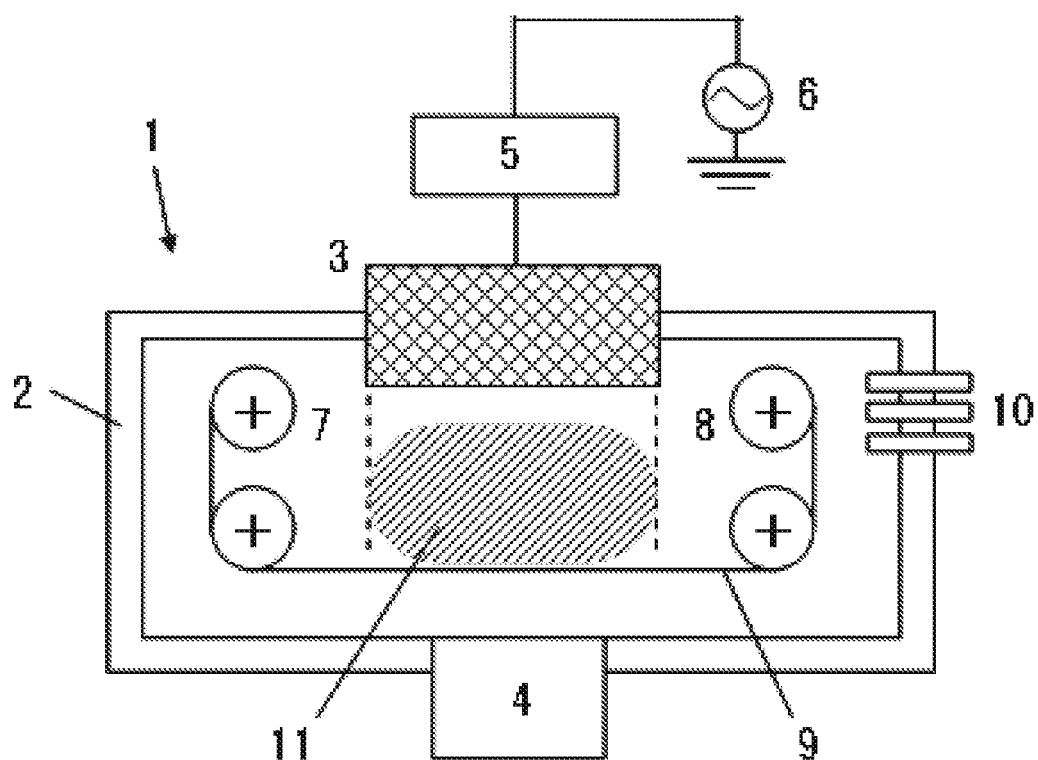
FIG. 1 is a view showing one example of an inductively-coupled plasma CVD apparatus for producing a laminated film of the present embodiment.

A laminated film according to the present invention is the aforementioned laminated film.

The laminated film described below is a laminated film in which a single thin film layer is formed on one of two main surfaces of a flexible base material. In the laminated film, a thin film layer may be formed not only on one of the surfaces of the flexible base material but also on the other surface. Here, the layer means a layer produced by a single production method.

The flexible base material is in the form of a film or a sheet, and examples of a material thereof include resin or a composite material containing resin.

Examples of the resin include polyethylene terephthalate (PET), polybutylene terephthalate (PBT), polyethylene naphthalate (PEN), acrylate, methacrylate, polycarbonate (PC), polyarylate, polyethylene (PE), polypropylene (PP), cyclic polyolefin (COP, COC), polyamide, aromatic polyamide, polystyrene, polyvinyl alcohol, saponificated ethylene-vinyl acetate copolymer, polyacrylonitrile, polyacetal, polyimide, polyether imide, polyamide imide, polyether sulfide (PES), and polyetheretherketone.

Examples of the composite material containing resin include silicone resin such as polydimethylsiloxane, organic-inorganic hybrid resin such as polysilsesquioxane, glass composite, and glass epoxy.

The material of the flexible base material may be of one kind or may be of two or more kinds.

Among these, as the material of the flexible base material, PET, PBT, PEN, cyclic polyolefin, polyimide, aromatic polyamide, glass composite or glass epoxy is preferred because of their high transparency and heat resistance and low coefficient of thermal expansion.

The flexible base material is preferably colorless and transparent because such a base material enables transmission and absorption of light. More specifically, total light transmission is preferably 80% or more, more preferably 85% or more. Moreover, a haze value is preferably 5% or less, more preferably 3% or less, further preferably 1% or less.

The flexible base material is preferably insulative because such a base material can be used for a base material of an electronic device, an energy device or the like, and preferably has an electric resistivity of $10^6$ Ωcm or more.

The thickness of the flexible base material can be set appropriately in consideration of stability in producing the laminated film. For example, the thickness is preferably 5 to 500 μm, more preferably 10 to 200 μm, further preferably 50 to 100 μm because the film can be conveyed also in a vacuum.

Note that the flexible base material may have at least one selected from the group consisting of a primer coat layer and an undercoat layer. When these layers exist on the surface of the flexible base material, a base material including these layers is regarded as the flexible base material in the present invention. The primer coat layer and/or the undercoat layer is used for improving adhesiveness between the flexible base material and a first thin film layer and/or flatness. The primer coat layer and/or the undercoat layer can be formed by appropriately using a known primer coating agent, a known undercoating agent or the like.

As the flexible base material, a base material subjected to a liquid washing treatment for cleaning the surface of a thin film layer forming side is preferred because adhesiveness to the thin film layer improves. Examples of the liquid washing treatment include a pure water washing treatment, an ultra-pure water washing treatment, an ultrasonic water washing treatment, a scrub washing treatment, a rinse washing treatment, and a double fluid rinse treatment.

As the flexible base material, a base material subjected to a surface activating treatment for cleaning the surface of a thin film layer forming side is preferred because adhesiveness to the thin film layer improves. Examples of the surface activating treatment include a corona treatment, a vacuum plasma treatment, an atmospheric pressure plasma treatment, a UV ozone treatment, a vacuum ultraviolet excimer lamp treatment, and a flame treatment.

Preferably, the first thin film layer is based on a compound represented by a general formula of $SiO_\alpha C_\beta$ because the first thin film layer obtains high denseness, and especially little fine gaps, cracks and the like. Here, "be based on" means that the content of a component in question relative to the mass of all components of the material is greater than 50% by mass, preferably 70% or more by mass, more preferably 90% or more by mass. In this general formula, α is selected from positive numbers of less than 2, and β is selected from positive numbers of less than 2. At least one of α and β in the general formula may be a constant value or may be varied in the thickness direction of the first thin film layer.

Further, the first thin film layer may contain other elements than a silicon atom, an oxygen atom and a carbon atom, for example, at least one selected from the group consisting of a hydrogen atom, a nitrogen atom, a boron atom, an aluminum atom, a phosphorus atom, a sulfur atom, a fluorine atom and a chlorine atom.

When the first thin film layer contains a hydrogen atom in addition to a silicon atom, an oxygen atom and a carbon atom, the first thin film layer is preferably based on a compound represented by a general formula of $SiO_\alpha C_\beta H_\gamma$. Here, "be based on" means that the content of a component in question relative to the mass of all components of the material is greater than 50% by mass, preferably 70% or more by mass, more preferably 90% or more by mass. In this general formula, $\alpha$ is selected from positive numbers of less than 2, $\beta$ is selected from positive numbers of less than 2, and $\gamma$ is selected from positive numbers of less than 6. At least one of $\alpha$, $\beta$ and $\gamma$ in the general formula may be a constant value or may be varied in the thickness direction of the first thin film layer.

When an average atomic number ratio of carbon atoms (C) to silicon atoms (Si) in the first thin film layer is represented by C/Si, the ratio preferably falls within the range of 0.1<C/Si<0.5, more preferably within the range of 0.15<C/Si<0.45, further preferably within the range of 0.2<C/Si<0.4, particularly preferably within the range of 0.25<C/Si<0.35 because the first thin film layer obtains high denseness, and especially little fine gaps, cracks and the like.

When an average atomic number ratio of oxygen atoms (O) to silicon atoms (Si) in the first thin film layer is represented by O/Si, the ratio preferably falls within the range of preferably 1.5<O/Si<1.9, more preferably within the range of 1.55<O/Si<1.85, further preferably within the range of 1.6<O/Si<1.8, particularly preferably within the range of 1.65<O/Si<1.75 because the first thin film layer obtains high denseness, and especially little fine gaps, cracks and the like.

Note that the average atomic number ratios C/Si and O/Si can be determined by conducting XPS depth profile measurement in the following conditions, and determining average atomic concentrations in the thickness direction of respective atoms from obtained distribution curves of a silicon atom, a nitrogen atom, an oxygen atom and a carbon atom, and subsequently calculating the average atomic number ratios C/Si and O/Si.

<XPS Depth Profile Measurement>

Etching ionic species: argon ($Ar^+$)

Etching rate (in terms of a $SiO_2$ thermally oxidized film): 0.05 nm/sec

Etching interval (in terms of $SiO_2$): 10 nm

X-ray photoelectron spectrometer: available from Thermo Fisher Scientific, model name "VG Theta Probe"

Irradiation X ray: single crystal spectroscopy $AlK\alpha$

Spot of X-ray and size thereof: oval shape of 800×400 µm.

Preferably, the first thin film layer is formed by a plasma chemical vapor deposition method (plasma CVD method) with use of glow discharge plasma.

The thickness of the first thin film layer is preferably 5 to 3000 nm because cracking is less likely to occur when the laminated film is bent. Further, when the first thin film layer is formed by a plasma CVD method with use of glow discharge plasma, the thickness is more preferably 10 to 2000 nm, further preferably 100 to 1000 nm because the first thin film layer is formed while electricity is discharged through the base material.

Preferably, the first thin film layer that the laminated film used in the present embodiment includes has such a high density as an average density of 1.8 g/cm³ or more. Note that the "average density" of the first thin film layer herein can be determined by calculating the weight of the first thin film layer in the measurement range from the number of silicon atoms, the number of atoms of carbon atoms, and the number of oxygen atoms determined by the Rutherford backscattering spectrometry (RBS) and the number of hydrogen atoms determined by the hydrogen forward scattering spectrometry (HFS), and dividing the weight by the volume of the first thin film layer in the measurement range (product of irradiation area of ion beam and film thickness (thickness)).

Due to the first thin film layer having a density of 1.8 g/cm³ or more, the laminated film obtains high denseness, and especially little fine gaps, cracks and the like. When the first thin film layer is composed of a silicon atom, an oxygen atom, a carbon atom and a hydrogen atom, the average density of the first thin film layer is less than 2.22 g/cm³.

In the present embodiment, a curve showing a relation between the distance from a first thin film layer surface in the thickness direction of the first thin film layer and a local atomic ratio of silicon atoms at a position of each distance is referred to as a silicon distribution curve. Here, the first thin film layer surface means the surface which is to be a surface of a laminate when a second thin film layer is removed from the laminated film. Similarly, a curve showing a relation between the distance from the first thin film layer surface in the thickness direction and a local atomic ratio of oxygen atoms at the position of each distance is referred to as an oxygen distribution curve. A curve showing a relation between the distance from the first thin film layer surface in the thickness direction and a local atomic ratio of carbon atoms at the position of each distance is referred to as a carbon distribution curve. A curve showing a relation between the distance from the first thin film layer in the thickness direction and a total of a local atomic ratio of oxygen atoms and an atomic ratio of carbon atoms at the position of each distance is referred to as an oxygen carbon distribution curve.

Preferably, the following conditions (i) to (iii) are satisfied in the silicon distribution curve, the oxygen distribution curve and the carbon distribution curve of the first thin film layer:

(i) an atomic number ratio of silicon, an atomic number ratio of oxygen and an atomic number ratio of carbon satisfy a condition represented by the following formula (1) in a region of 90% or more in the thickness direction of the first thin film layer;

(Atomic number ratio of oxygen)>(Atomic number ratio of silicon)>(Atomic number ratio of carbon)     (1)

(ii) the carbon distribution curve has at least one extreme; and (iii) an absolute value of a difference between a maximum value and a minimum value of the atomic number ratio of carbon in the carbon distribution curve is 0.05 or more.

Preferably, the carbon distribution curve of the first thin film layer is substantially continuous. The "carbon distribution curve is substantially continuous" means that the carbon distribution curve does not include a part where the atomic ratio of carbon varies discontinuously. Specifically, when the distance from the first thin film layer surface in the thickness direction is x [nm], and the atomic ratio of carbon is C, the following formula is preferably satisfied.

$$|dC/dx| \leq 0.01$$

Preferably, the carbon distribution curve of the first thin film layer has at least one extreme. The extreme used here means a maximum value or a minimum value of an atomic ratio of each element with respect to the distance from the first thin film layer surface in the thickness direction. The extreme is a value of an atomic ratio at a point where increase in the atomic ratio of the element turns into decrease, or a point where decrease in the atomic ratio of the element turns into increase, when the distance from the first thin film layer surface in the thickness direction is varied. The extreme can be determined, for example, based on a measurement result obtained by measuring the atomic ratio at each of a plurality of measurement positions in the thickness direction. The measurement positions of the atomic ratio are set at an interval in the thickness direction of 20 nm or less, for example. A position where the extreme appears can be obtained by comparing measurement results at three or more different measurement positions, for example, for a discrete data group containing the measurement result at each measurement position, and determining a position where increase in the measurement result turns into decrease, or a position where decrease in the measurement result turns into increase. The position where the extreme appears can also be obtained by differentiating an approximation curve determined from the discrete data group. When the interval where the atomic ratio monotonically increases or monotonically decreases from the position where the extreme appears is, for example, 20 nm or more, an absolute value of a difference between the extreme and the atomic ratio at the position of 20 nm in the thickness direction from the position where the extreme appears is, for example, 0.03 or more.

In the first thin film layer formed to satisfy the condition that the carbon distribution curve has at least one extreme, an increment in gas permeability after bending relative to gas permeability before bending is smaller than that in the case where the condition is not satisfied. That is, an effect of suppressing reduction in a gas barrier property due to bending is obtained by satisfying the condition. In the case where the first thin film layer is formed such that the number of the extremes in the carbon distribution curve is two or more, the increment reduces in comparison with the case where the number of the extremes in the carbon distribution curve is one. In the case where the first thin film layer is formed such that the number of the extremes in the carbon distribution curve is three or more, the increment reduces in comparison with the case where the number of the extremes in the carbon distribution curve is two. In the case where the carbon distribution curve has two or more extremes, an absolute value of a difference between the distance from the first thin film layer surface in the thickness direction at a position where the first extreme appears, and the distance from the first thin film layer surface in the thickness direction at a position where the second extreme adjacent to the first extreme appears is preferably within the range of 1 nm to 200 nm inclusive, and more preferably within the range of 1 nm to 100 nm inclusive.

The absolute value of the difference between the maximum value and the minimum value of the atomic ratio of carbon in the carbon distribution curve of the first thin film layer is preferably 0.05 or more. In the first thin film layer formed to satisfy the condition, the increment in the gas permeability after bending relative to the gas permeability before bending reduces in comparison with the case where the condition is not satisfied. That is, an effect of suppressing reduction in a gas barrier property due to bending is obtained by satisfying the condition. When the absolute value of the difference between the maximum value and the minimum value of the atomic ratio of carbon is 0.06 or more, the effect becomes higher, and when the absolute value is 0.07 or more, the effect becomes still higher.

Since there is a tendency that a gas barrier property improves as an absolute value of a difference between a maximum value and a minimum value of the atomic ratio of silicon in the silicon distribution curve decreases, the absolute value is preferably less than 0.05, more preferably less than 0.04, particularly preferably less than 0.03.

In the oxygen carbon distribution curve, when the total of the local atomic ratio of oxygen atoms and atomic ratio of carbon atoms at each distance position is a "total atomic ratio," since there is a tendency that a gas barrier property of the first thin film layer improves as an absolute value of a difference between a maximum value and a minimum value of the total atomic ratio decreases, the total atomic ratio is preferably less than 0.05, more preferably less than 0.04, particularly preferably less than 0.03.

When composition of the first thin film layer is made substantially uniform in the first thin film layer surface direction, it is possible to achieve a uniform and improved gas barrier property of the first thin film layer. The "composition is substantially uniform" means that the number of the extremes is the same at any two positions in the first thin film layer surface in the oxygen distribution curve, the carbon distribution curve and the oxygen carbon distribution curve, and the absolute value of the difference between the maximum value and the minimum value of the atomic ratio of carbons in each carbon distribution curve is equal to each other or differs from each other by 0.05 or less.

Preferably, the silicon distribution curve, the oxygen distribution curve and the carbon distribution curve of the first thin film layer satisfy the following condition. That is, the condition is such that the atomic ratio of oxygen is larger than the atomic ratio of silicone, and the atomic ratio of silicon is larger than the atomic ratio of carbon in the region of 90% or more of the thickness of the first thin film layer in the silicon distribution curve, the oxygen distribution curve and the carbon distribution curve.

(Atomic ratio of oxygen)>(Atomic ratio of silicon)>(Atomic ratio of carbon)

The first thin film layer formed to satisfy the condition is capable of expressing a gas barrier property required for a flexible electronic device or the like using, for example, an organic EL device.

The first thin film layer may be subjected to a liquid washing treatment for cleaning a surface of the first thin film layer because adhesiveness to the second thin film layer described below improves. Examples of the liquid washing treatment include a pure water washing treatment, an ultrapure water washing treatment, an ultrasonic water washing treatment, a scrub washing treatment, a rinse washing treatment, and a double fluid rinse treatment.

The first thin film layer may be subjected to a surface activating treatment for cleaning a surface of the first thin film layer because adhesiveness to the second thin film layer described below improves. Examples of the surface activating treatment include a corona treatment, a vacuum plasma treatment, an atmospheric pressure plasma treatment, a UV ozone treatment, a vacuum ultraviolet excimer lamp treatment, and a flame treatment.

Preferably, the second thin film layer contains a silicon atom, an oxygen atom and a nitrogen atom, and is based on a compound represented by a general formula of $SiO_\alpha N_\beta$ because both flexibility and a gas barrier property can be achieved. Here, "be based on" means that the content of a component in question relative to the mass of all components of the material is greater than 50% by mass, preferably 70% or more by mass, more preferably 90% or more by mass. In this general formula, α is selected from positive numbers of less than 1, and β is selected from positive numbers of less than 3. At least one of α and β in this general formula may be a constant value or may be varied in the thickness direction of the second thin film layer.

Further, the second thin film layer may contain other elements than a silicon atom, an oxygen atom and a nitrogen atom, for example, at least one selected from the group consisting of a carbon atom, a boron atom, an aluminum atom, a phosphorus atom, a sulfur atom, a fluorine atom and a chlorine atom.

The second thin film layer may contain a silicon atom, an oxygen atom, a nitrogen atom and a hydrogen atom. In that case, the thin film layer is preferably based on a compound represented by a general formula of $SiO_\alpha N_\beta H_\gamma$. In this general formula, α is selected from positive numbers of less than 1, β is selected from positive numbers of less than 3, and γ is selected from positive numbers of less than 10. At least one of α, β and γ in this general formula may be a constant value or may be varied in the thickness direction of the second thin film layer.

Further, the second thin film layer may contain other elements than a silicon atom, an oxygen atom, a nitrogen atom and a hydrogen atom, for example, at least one selected from a carbon atom, a boron atom, an aluminum atom, a phosphorus atom, a sulfur atom, a fluorine atom and a chlorine atom.

In the second thin film layer, an average atomic number ratio of the number of silicon atoms to the total number of silicon atoms, oxygen atoms, nitrogen atoms and carbon atoms falls preferably within the range of 0.10 to 0.50, more preferably within the range of 0.15 to 0.45, further preferably within the range of 0.20 to 0.40.

In the second thin film layer, an average atomic number ratio of the number of oxygen atoms to the total number of silicon atoms, oxygen atoms, nitrogen atoms and carbon atoms falls preferably within the range of 0.05 to 0.50, more preferably within the range of 0.10 to 0.45, further preferably within the range of 0.15 to 0.40.

In the second thin film layer, an average atomic number ratio of the number of nitrogen atoms to the total number of silicon atoms, oxygen atoms, nitrogen atoms and carbon atoms falls preferably within the range of 0.40 to 0.80, more preferably within the range of 0.45 to 0.75, further preferably within the range of 0.50 to 0.70.

In the second thin film layer, an average atomic number ratio of the number of carbon atoms to the total number of silicon atoms, oxygen atoms, nitrogen atoms and carbon atoms falls preferably within the range of 0 to 0.05, more preferably within the range of 0.005 to 0.04, further preferably within the range of 0.01 to 0.03.

Note that the average atomic number ratios Si, O and N can be determined by conducting XPS depth profile measurement in the following conditions, and determining average atomic concentrations in the thickness direction of respective atoms from obtained distribution curves of a silicon atom, a nitrogen atom, an oxygen atom and a carbon atom, and subsequently calculating the average atomic number ratios Si, O and N.

<XPS Depth Profile Measurement>

Etching ionic species: argon ($Ar^+$)

Etching rate (in terms of a $SiO_2$ thermally oxidized film): 0.05 nm/sec

Etching interval (in terms of $SiO_2$): 10 nm

X-ray photoelectron spectrometer: available from Thermo Fisher Scientific, model name "VG Theta Probe"

Irradiation X ray: single crystal spectroscopy AlKα

Spot of X-ray and size thereof: oval shape of 800×400 μm.

A refractive index of the second thin film layer falls preferably within the range of 1.6 to 1.9, more preferably within the range of 1.65 to 1.85, further preferably within the range of 1.7 to 1.8 because a gas barrier property and transparency can be enhanced. The refractive index of the thin film layer can be calculated by conducting evaluation by using spectroscopic ellipsometry, and determining the real part n of the complex refractive index at 550 nm.

Preferably, the second thin film layer is formed by a plasma chemical vapor deposition method (plasma CVD method) with use of glow discharge plasma.

The thickness of the second thin film layer is preferably 5 to 3000 nm, more preferably 10 to 2000 nm, further preferably 80 to 1500 nm, particularly preferably 100 to 1000 nm because a gas barrier property and transparency can be enhanced.

When X-ray photoelectron spectrometry is conducted for a surface of the second thin film layer, an atomic number ratio of carbon atoms to silicon atoms calculated from a wide scan spectrum preferably falls within the range of the following formula (2).

$$0 < C/Si \leq 0.2 \quad (2)$$

The atomic number ratio of carbon atoms to silicon atoms calculated from the wide scan spectrum represents an atomic number ratio in an outermost surface of the second thin film layer. In the laminated film satisfying the relation represented by the formula (2), impurities contained in a raw material formed in the outermost surface of the second thin film layer, impurities occurring during deposition, impurities having adhered after deposition or the like are reduced, and when another layer is formed on the thin film layer, excellent adhesion durability is obtained. The range of the atomic number ratio of carbon atoms to silicon atoms is preferably the range of $C/Si \leq 0.2$, more preferably the range of $C/Si \leq 0.15$ because impurities in the outermost surface of the second thin film layer can be reduced. The range of $C/Si > 0$ is preferred, and the range of $C/Si \geq 0.02$ is more preferred because impurities adhering from the external environment are less likely to influence, and control of wettability of the outermost surface of the second thin film layer is facilitated.

Here, the surface of the second thin film layer means a surface of a laminate when the second thin film layer exists in an outermost surface of the laminate, or means a surface which is to be the surface of the laminate when every layer existing on the second thin film layer is removed from the laminated film in the case where another layer further exists on the second thin film layer (on a surface farther from the base material in the second thin film layer). In the case where another layer is formed on the second thin film layer, it is preferred to measure the wide scan spectrum before forming another layer, and in the case where another layer has already been formed, every layer existing on the second thin film layer can be removed from the laminated film to measure the wide scan spectrum.

The wide scan spectrum can be measured by X-ray photoelectron spectroscopy (available from ULVAC PHI, Quantera SXM). An AlKα ray (1486.6 eV, X-ray spot 100 μm) is used as an X-ray source, and a neutralized electron gun (1 eV), and a low speed Ar ion gun (10 V) are used for charge correction at the time of measurement. Regarding analysis after the measurement, spectrum analysis is conducted by using MultiPak V6.1A (ULVAC-PHI, Inc.), and the atomic number ratio of C to Si can be calculated by using peaks corresponding to binding energy of Si:2p, O:1s, N:1s, C:1s obtained from the measured wide scan spectrum.

As a technique for controlling the atomic number ratio represented by formula (2), a surface activating treatment for cleaning the second thin film layer surface is preferred. Examples of the surface activating treatment include a corona treatment, a vacuum plasma treatment, an atmospheric pressure plasma treatment, a UV ozone treatment, a vacuum ultraviolet excimer lamp treatment, and a flame treatment.

When another layer is further formed on the layer of the second thin film layer, it is preferred to conduct the X-ray photoelectron spectrometry before forming another layer, but another layer can be removed to conduct the measurement even after formation of another layer.

Preferably, the thickness of the second thin film layer is 80 nm or more, silicon atoms and oxygen atoms are contained in the depth range up to 40 nm in the thickness direction toward inside the second thin film layer from a surface of the second thin film layer, and an atomic number ratio of nitrogen atoms to silicon atoms falls within the range of the following formula (3), because both flexibility and a gas barrier property can be achieved. Here, the surface of the second thin film layer means a surface of a laminate when the second thin film layer exists in an outermost surface of the laminate, or means a surface which becomes the surface of the laminate when every layer existing on the second thin film layer is removed from the laminated film in the case where another layer further exists on the second thin film layer (on a surface farther from the base material in the second thin film layer).

$$N/Si \leq 0.2 \qquad (3)$$

The atomic number ratio can be measured by the aforementioned XPS depth profile measurement.

In the depth range up to 40 nm in the thickness direction toward inside the second thin film layer from the surface of the second thin film layer, the film is preferably based on a compound represented by a general formula of $SiO_\alpha$. $\alpha$ is preferably a number of 1.5 to 3.0, more preferably a number of 2.0 to 2.5. $\alpha$ may be a constant value or may be varied in the depth up to 40 nm in the thickness direction toward inside the second thin film layer from the surface of the second thin film layer.

Preferably, the thickness of the second thin film layer is 80 nm or more, silicon atoms and nitrogen atoms are contained in the depth range up to 40 nm in the thickness direction toward inside the second thin film layer from an interface between the second thin film layer and the first thin film layer, and an atomic number ratio of nitrogen atoms to silicon atoms falls within the range of the following formula (4), because both flexibility and a gas barrier property can be achieved.

$$N/Si \leq 0.2 \qquad (4)$$

The atomic number ratio can be measured by the aforementioned XPS depth profile measurement.

In the depth range up to 40 nm in the thickness direction toward inside the second thin film layer from the interface between the second thin film layer and the first thin film layer, the film is preferably based on a compound represented by a general formula of $SiO_\alpha$. $\alpha$ is preferably a number of 1.5 to 3.0, more preferably a number of 2.0 to 2.5. $\alpha$ may be a constant value or may be varied in the depth up to 40 nm in the thickness direction toward inside the second thin film layer from the surface of the second thin film layer.

In the second thin film layer, an intensity ratio I'/I between a peak intensity (I) existing between 810 to 880 $cm^{-1}$ and a peak intensity (I') existing between 2100 to 2200 $cm^{-1}$ in an infrared absorption spectrum obtained by infrared spectrometry preferably falls within the range represented by the following formula (5) because both transparency and a gas barrier property can be achieved.

$$0.05 \leq I'/I \leq 0.20 \qquad (5)$$

Note that in the measurement of the infrared absorption spectrum of the second thin film layer, a cyclic cycloolefin film (for example, ZEONOR ZF16 film available from ZEON CORPORATION) is used as the base material, and after the second thin film layer is formed singly on the surface of the base material, the infrared absorption spectrum can be calculated. The infrared absorption spectrum can be measured by using a Fourier transformation type infrared spectrophotometer (FT/IR-460Plus, available from JASCO Corporation) equipped with an ATR attachment (PIKE MIRacle) using germanium crystals for a prism. The second thin film layer is obtained by forming an induction field by applying high-frequency power on an induction coil with use of a commonly used inductively-coupled plasma CVD apparatus, and introducing a source gas to generate plasma, and forming a thin film on the base material. When a production condition of the second thin film layer is unknown, only the second thin film layer may be taken off to measure the infrared absorption spectrum.

An absorption peak existing between 810 and 880 $cm^{-1}$ is imputed to Si—N, and an absorption peak existing between 2100 and 2200 $cm^{-1}$ is imputed to Si—H. That is, I'/I is preferably 0.20 or less in order that the thin film layer can have a denser structure because a gas barrier property can be enhanced, and I'/I is preferably 0.05 or more because transparency can be enhanced.

The second thin film layer may be subjected to a liquid washing treatment for cleaning a surface of the second thin film layer because adhesion durability improves when another inorganic film or organic film is formed on the second thin film layer. Examples of the liquid washing treatment include a pure water washing treatment, an ultrapure water washing treatment, an ultrasonic water washing treatment, a scrub washing treatment, a rinse washing treatment, and a double fluid rinse treatment.

The second thin film layer may be subjected to a surface activating treatment for cleaning a surface of the second thin film layer because adhesion durability improves when another inorganic film or organic film is formed on the second thin film layer. Examples of the surface activating treatment include a corona treatment, a vacuum plasma treatment, an atmospheric pressure plasma treatment, a UV ozone treatment, a vacuum ultraviolet excimer lamp treatment, and a flame treatment.

When the thickness (T1) of the first thin film layer relative to the total thickness (T) of the first thin film layer and the second thin film layer is represented by a thickness ratio (T1/T), the thickness ratio is preferably in the range of $0.02 \leq T1/T \leq 0.98$, more preferably in the range of $0.05 \leq T1/T \leq 0.95$, further preferably in the range of $0.08 \leq T1/T \leq 0.92$, particularly preferably in the range of $0.10 \leq T1/T \leq 0.90$ because adhesiveness between the base material and the first thin film layer, and a gas barrier property can be enhanced.

Note that the laminated film may have at least one selected from the group consisting of a heat sealable resin layer, an overcoat layer and an adhesive layer on the second thin film layer, in addition to the first and second thin film layers. When these layers exist on the surface of the second thin film layer, a film including these layers is regarded as the laminated film in the present invention. The heat sealable resin layer can be formed by appropriately using a known heat sealable resin or the like. The overcoat layer is used for protecting the second thin film layer, or improving adhesiveness to another member and/or flatness. The overcoat layer can be formed by appropriately using a known overcoat agent or the like. The adhesive layer is used, for example, for mutual adhesion of a plurality of laminated films, or for adhesion of the laminated film to another member. The adhesive layer can be formed by appropriately using a known adhesive or the like.

Total light transmission is preferably 80% or more, more preferably 85% or more because the laminated film of the present invention has high transparency. The total light transmission can be measured by a direct reading haze computer (model HGM-2DP) available from Suga Test Instruments Co., Ltd.

[Method for Producing Laminated Film]

The laminated film of the present invention can be produced by forming the first thin film layer and the second thin film layer on the flexible base material by a known vacuum deposition technique such as plasma CVD method with use of glow discharge plasma.

After deposition of the highly adhesive first thin film layer on the flexible base material, the second thin film layer is preferably formed by an inductively-coupled plasma CVD method among vacuum deposition techniques. The inductively-coupled plasma CVD method is a technique for forming an induction field by applying high-frequency power on an induction coil, and generating plasma. Since the generated plasma is highly dense and low temperature plasma, the plasma is suited for forming a dense thin film on the flexible base material.

In the case of forming (depositing) the first thin film layer by the plasma CVD method, it is preferred to form the first thin film layer by a plasma CVD method in which the flexible base material is disposed on a pair of deposition electrodes, and electricity is discharged between the pair of deposition electrodes to generate plasma. The pair of deposition electrodes may be in the form of parallel plates or may be in the form of rolls. When the electricity is discharged between the pair of deposition rolls, it is preferred to alternately inverse the polarity of the pair of deposition rolls.

In the generating plasma in the plasma CVD method, it is preferred to generate plasma discharge in a space between a plurality of deposition rolls, and it is more preferred to use a pair of deposition rolls, to dispose the base material on each of the pair of deposition rolls, and to discharge electricity between the pair of deposition rolls to generate plasma. The using a pair of deposition rolls, disposing the base material on each of the pair of deposition rolls, and discharging electricity between the pair of deposition rolls makes it possible to deposit a surface part of the base material existing on one of the deposition rolls while simultaneously depositing a surface part of the base material existing on the other of the deposition rolls at the time of deposition, and thus not only the first thin film layer can be formed efficiently, but also a deposition rate can be doubled. Moreover, it is preferred to form the first thin film layer on the surface of the base material by a roll-to-roll method because productivity is excellent. A non-limiting preferred example of an apparatus that can be used in producing a laminated film by the plasma CVD method includes an apparatus having at least a pair of deposition rolls and a plasma power source, and having a configuration capable of discharging electricity between the pair of deposition rolls.

An example of a deposition apparatus applied in the plasma CVD method of the roll-to-roll method includes an apparatus equipped with a delivery roll, a conveyance roll, a deposition roll, a conveyance roll, and a winding roll in sequence from the upstream side of deposition (upstream side in the conveyance direction of the base material), and equipped with a gas feeding tube, a power source for plasma generation and a magnetic field generator. Among these, at least the deposition roll, the gas feeding tube and the magnetic field generator are disposed in a vacuum chamber during formation of the first thin film layer, and this vacuum chamber is connected with a vacuum pump. An internal pressure of the vacuum chamber is adjusted by operation of the vacuum pump.

Preferably, the deposition apparatus is equipped with a pair of deposition rolls as the deposition roll, and is further equipped with a conveyance roll between these deposition rolls. Then, preferably magnetic field generators are disposed inside the deposition rolls, and these magnetic field generators are attached such that their statures do not change with rotation of the deposition rolls.

When such a deposition apparatus is used, the base material wound around the delivery roll is conveyed from the delivery roll to the former (upstream side) deposition roll via the conveyance roll on the uppermost stream side. The film base material in which the first thin film layer is formed on the surface of the base material is conveyed from the former deposition roll to the later (downstream side) deposition roll via the conveyance roll. The resultant laminated film in which the first thin film layer is formed by further deposition is conveyed from the later deposition roll to the winding roll via the conveyance roll on the downstream side (downmost stream side), and is wound around this winding roll.

In the deposition apparatus, the pair of (former and later) deposition rolls are disposed so as to be opposed to each other. Axes of these deposition rolls are substantially parallel, and diameters of these deposition rolls are substantially the same. In such a deposition apparatus, deposition is conducted while the base material is conveyed on the former deposition roll and while the film base material is conveyed on the later deposition roll.

In the deposition apparatus, plasma can be generated in the space sandwiched between the pair of deposition rolls. A power source for plasma generation is electrically connected with electrodes in these deposition rolls, and these electrodes are disposed to sandwich the space.

The deposition apparatus can generate plasma by electric power supplied to the electrodes from the power source for plasma generation. A known power source or the like can be used appropriately as the power source for plasma generation, and an example of the power source includes an AC power source capable of alternately inverting the polarity of the two electrodes. In the power source for plasma generation, the electric power supplied therefrom is set, for example, at 0.1 to 10 kW, and a frequency of an alternate current is set, for example, at 50 Hz to 100 MHz because deposition can be conducted efficiently. The AC frequency set at 1 MHz to 100 MHz may be used because decomposition efficiency of the source gas improves.

The magnetic field generator disposed inside the deposition rolls can generate a magnetic field in the space, and the magnetic field may be generated such that a magnetic flux density changes in the conveyance direction on the deposition rolls.

The gas feeding tube can feed a feed gas for use in formation of the first thin film layer into the space. The feed gas contains the source gas of the first thin film layer. The source gas fed from the gas feeding tube is decomposed by the plasma generated in the space, and a film component of the thin film layer is generated. The film component of the first thin film layer deposits on the base material or the film base material being conveyed on the pair of deposition rolls.

As the source gas, for example, an organic silicon compound containing silicon can be used. Examples of the organic silicon compound include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. Among these organic silicon compounds, hexamethyldisiloxane, and 1,1,3,3-tetramethyldisiloxane are preferred because handleability of the compounds and a gas barrier property of the resultant thin film layer are excellent. The organic silicon compounds may be used singly or in combination of two or more kinds.

The source gas may contain monosilane in addition to the organic silicon compound, and may be used as a silicon source for a barrier film to be formed.

The feed gas may contain a reaction gas in addition to the source gas. As the reaction gas, a gas that reacts with the source gas to become an inorganic compound such as oxide, nitride and the like may be selected appropriately and used. Examples of the reaction gas for forming an oxide include oxygen and ozone. Examples of the reaction gas for forming a nitride include nitrogen and ammonia. These reaction gases may be used singly or in combination of two or more kinds, and for example, in the case of forming an oxynitride, the reaction gas for forming an oxide and the reaction gas for forming a nitride can be used in combination.

The feed gas may contain at least one of a carrier gas and a discharging gas. A gas that promotes feeding of the source gas into the vacuum chamber can be selected appropriately and used as the carrier gas. A gas that promotes generation of plasma discharge in a space SP can be selected appropriately and used as the discharging gas. Examples of the carrier gas and the discharging gas include noble gas such as helium gas, argon gas, neon gas, and xenon gas; and hydrogen gas. Any of the carrier gas and the discharging gas can be used singly or in combination of two or more kinds.

Hereinafter, the case of producing a silicon-oxygen-based first thin film layer will be described as an example. A feed gas in the present example contains hexamethyldisiloxane (organic silicon compounds: HMDSO: $(CH_3)_6Si_2O$) as a source gas, and oxygen ($O_2$) as a reaction gas.

In the plasma CVD method, after reaction of a feed gas G containing hexamethyldisiloxane and oxygen, silicon dioxide is generated by reaction represented by the following formula (A).

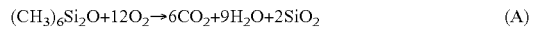

$$(CH_3)_6Si_2O+12O_2 \rightarrow 6CO_2+9H_2O+2SiO_2 \qquad (A)$$

A ratio of the amount of the reaction gas to the amount of the source gas in the feed gas is set, for example, in such a manner that the ratio is not excessively higher than a ratio that is stoichiometrically required for complete reaction of the source gas (stoichiometric ratio). For example, in the reaction represented by formula (A), the amount of oxygen stoichiometrically required for complete oxidation of 1 mole of hexamethyldisiloxane is 12 moles. That is, when the feed gas G contains 12 moles or more of oxygen relative to 1 mole of hexamethyldisiloxane, a uniform silicon dioxide film will be formed as a thin film layer theoretically. However, actually, a part of the fed reaction gas can fail to contribute to the reaction. Accordingly, for complete reaction of the source gas, generally, a gas containing a reaction gas at a ratio higher than the stoichiometric ratio is fed. Actually, a molar ratio of the reaction gas that enables complete reaction of the source gas, to the source gas (hereinafter, referred to as an "effective ratio") can be examined, for example, experimentally. For example, for complete oxidation of hexamethyldisiloxane by the plasma CVD method, there may be the case where the molar amount of oxygen (flow rate) is set 20 times (the effective ratio may be set at 20) or more a molar ratio (flow rate) of hexamethyldisiloxane which is a source. Therefore, the ratio of the amount of the reaction gas to the amount of the source gas in the feed gas may be less than the effective ratio (for example, 20), or may be less than or equal to the stoichiometric ratio (for example, 12), or may be less than the stoichiometric ratio (for example, 10).

In the present example, when a reaction condition is set to be a condition where the reaction gas is not enough for the source gas to completely react, carbon atoms and hydrogen atoms in hexamethyldisiloxane that is not completely oxidized are taken into the first thin film layer. For example, the first thin film layer satisfying a predetermined condition can be formed by appropriately adjusting one or more of parameters in the deposition apparatus, such as the kind of the source gas, the ratio of the molar amount of the reaction gas to the molar amount of the source gas in the feed gas, the electric power supplied to the electrodes, the internal pressure of the vacuum chamber, the diameters of the pair of deposition rolls, and conveyance speed of the base material (film base material). Note that the one or more of the parameters may vary temporally in a period in which the base material (film base material) passes through a deposition area facing the space, or may vary spatially in the deposition area.

The electric power supplied to the electrodes can be adjusted appropriately depending on the kind of the source gas, the internal pressure of the vacuum chamber and the like, and can be set, for example, at 0.1 to 10 kW. The electric power of 0.1 kW or more enhances an effect of suppressing generation of particles. The electric power of 10 kW or less enhances an effect of suppressing occurrence of wrinkles or damages on the flexible base material due to the heat from the electrodes.

The internal pressure of the vacuum chamber (degree of vacuum) is disposed within a vent, and can be adjusted appropriately depending on the kind of the source gas or the like, and can be set, for example, at 0.1 Pa to 50 Pa, preferably 0.2 Pa to 10 Pa, more preferably 0.3 Pa to 5 Pa, further preferably 0.4 Pa to 2 Pa, particularly preferably 0.5 Pa to 1.5 Pa.

The conveyance speed of the flexible base material (line speed) can be adjusted appropriately depending on the kind of the source gas, the internal pressure of the vacuum chamber or the like, but the conveyance speed is preferably the same as conveyance speed of the base material when the base material is brought into contact with the conveyance roll.

Preferably, the second thin film layer is formed on the first thin film layer as a thin film by forming an induction field by applying high-frequency power on an induction coil with use of a commonly used inductively-coupled plasma CVD apparatus, and introducing a source gas to generate plasma (for example, see JP-A-2006-164543).

FIG. 1 shows one example of an inductively-coupled plasma CVD apparatus for producing the laminated film of the present embodiment. In a vacuum chamber 2, a delivery roll 7 and a winding roll 8 are disposed, and a flexible base material 9 with a first thin film layer is continuously conveyed. The delivery roll 7 and the winding roll 8 can be inverted depending on situations, and the delivery roll can be changed to the winding roll, and the winding roll can be changed to the delivery roll appropriately. Above a deposition part 11 where the second thin film layer is formed on the base material 9, an induction coil 3 for generating a magnetic field via a rectangular dielectric window composed of aluminum oxide or the like is provided, and gas introducing piping 10 and a vacuum pump 4 for discharging excessive gas are provided. A straightening vane for making the gas uniform may be provided near a part where the gas is introduced and discharged. The induction coil 3 is connected with a high-frequency power source 6 via a matching box 5.

The laminated film of the present invention is produced, for example, by using this inductively-coupled plasma CVD apparatus 1, in such a manner that a source gas is fed from the gas introducing piping 10 while the flexible base material 9 with a first thin film layer is conveyed at a constant speed, and plasma is generated by the induction coil 3 in the deposition part 11, and the second thin film layer composed by decomposing and recombining the source gas is formed on the base material 9.

In the formation of the second thin film layer, the base material is conveyed at a constant speed in such a manner that the conveyance direction of the base material is parallel with one of two opposite sides of the rectangular dielectric window disposed above the deposition part 11 and is perpendicular to the other of the two opposite sides. As a result, during passage through the deposition part 11, a plasma density decreases directly below the two opposite sides of the dielectric window that are perpendicular to the conveyance direction of the base material, and in association with this, thin film layer composition after the decomposition and recombination of the source gas changes, and the third thin film layer and the fourth thin film layer can be formed stably.

The second thin film layer is formed by using an inorganic silane gas, an ammonia gas, an oxygen gas and an inert gas as the source gas. The second thin film layer is formed by flow of the source gas at a flow rate and a flow ratio that are each in the range used in an ordinary inductively-coupled plasma CVD method. Examples of the inorganic silane gas include hydrogenated silane gas and halogenated silane gas such as monosilane gas, disilane gas, trisilane gas, dichlorosilane gas, trichlorosilane gas, and tetrachlorosilane gas. Among these inorganic silane gases, monosilane gas and disilane gas are preferred because handleability of the compounds and denseness of the resultant second thin film layer are excellent. These inorganic silane gases may be used singly or in combination of two or more kinds. Examples of the inert gas include nitrogen gas, argon gas, neon gas, and xenon gas.

Electric power supplied to electrodes can be adjusted appropriately depending on the kind of the source gas, an internal pressure of the vacuum chamber and the like, and is set, for example, at 0.1 to 10 kW, and a frequency of an alternate current is set, for example, at 50 Hz to 100 MHz. The electric power of 0.1 kW or more enhances an effect of suppressing generation of particles. Moreover, the electric power of 10 kW or less enhances an effect of suppressing occurrence of wrinkles or damages on the flexible base material with the first thin film layer due to heat from the electrodes. Further, the AC frequency set at 1 MHz to 100 MHz may be used because decomposition efficiency of the source gas improves.

The internal pressure of the vacuum chamber (degree of vacuum) can be adjusted appropriately depending on the kind of the source gas or the like, and can be set, for example, at 0.1 Pa to 50 Pa, but the internal pressure of the vacuum chamber is preferably 0.2 Pa to 10 Pa, more preferably 0.3 Pa to 5 Pa, further preferably 0.4 Pa to 2 Pa, particularly preferably 0.5 Pa to 1.5 Pa.

Conveyance speed of the flexible base material with a first thin film layer can be adjusted appropriately depending on the kind of the source gas, the internal pressure of the vacuum chamber or the like, but the conveyance speed is preferably the same as conveyance speed of the base material when the base material is brought into contact with the conveyance roll.

It is preferred to form the first and second thin film layers in a continuous deposition process, and it is more preferred to continuously form a thin film layer on a long base material while the long base material is conveyed continuously.

The first and second thin film layers can further be formed from above by inverting the delivery roll and the winding roll and conveying the base material in the reverse direction after the first and second thin film layers are formed while the flexible base material is conveyed from the delivery roll to the winding roll. Modification can be made appropriately depending on the desired number of laminated layers, the thickness and the conveyance speed.

The laminated film in the present invention provides a laminated film capable of simultaneously achieving a gas barrier property, optical characteristics, flexibility and an adhesion property by forming a colorless and transparent thin film having high optical characteristics on a thin film layer having high adhesiveness to abase material. The laminated film in the present invention can be used for application of packaging of foods, industrial articles, pharmaceuticals and the like for which a gas barrier property is required, and is preferably used as a flexible substrate of an electronic device such as a liquid crystal display device, a solar battery and an organic EL.

When the laminated film is used as a flexible substrate of an electronic device, the device may be formed directly on the laminated film, or the laminated film may be overlapped from above after the device is formed on another substrate.

EXAMPLES

Hereinafter, the preset invention will be described further in detail by way of Examples. Note that a thickness ratio between a first thin film layer and a second thin film layer, adhesiveness between a base material and a thin film layer, a gas barrier property and optical characteristics of the laminated film were evaluated by the following methods.

<Method for Calculating Thickness Ratio Between Thin Film Layers>

A first thin film layer (SiOC) was formed on a flexible base material, and a step between a non-deposition part and a deposition part was measured by using SURFCORDER ET200 available from Kosaka Laboratory Ltd., to determine the thickness (T1) of the first thin film layer. Moreover, a first thin film layer (SiOC) and a second thin film layer (SiON) were formed sequentially on a flexible base material, and a step between a non-deposition part and a deposition part was measured by the same method to determine the total thickness (T).

A thickness ratio of the first thin film layer to the total thickness was determined from T1/T.

<Adhesiveness Between Base Material and Thin Film Layer>

After a laminated film was dipped in hot water at 90° C. for 1 hour, water having adhered to the surface was removed, and then a cross-cut test (conforming to JIS K 5600-5-6) was conducted. The case where no peeling was observed at any location after peeling off of the tape was determined as "o," and the case where peeling was observed at any location was determined as "x."

<Gas Barrier Property of Laminated Film>

A gas barrier property of a laminated film was measured by a calcium corrosion method (method described in JP-A-2005-283561) in a condition of a temperature of 40° C. and humidity of 90% RH, and water vapor permeability of the laminated film was determined.

<Flexibility of Laminated Film>

Flexibility of a laminated film was determined in the following manner. In the environment at a temperature of 23° C. and humidity of 50% RH, the laminated film was wound once around a bar available from SUS and having a diameter of 30 mm such that a thin film layer was outside, and water vapor permeability (P2) was determined for the laminated film by a calcium corrosion method (method described in JP-A-2005-283561) in a condition of a temperature of 40° C. and humidity of 90% RH, and a ratio (P2/P1) of the water vapor permeability (P2) to water vapor permeability before winding was determined and indicated by percentage.

<Optical Characteristics of Laminated Film>

Total light transmission of a laminated film was measured by a direct reading haze computer (model HGM-2DP) available from Suga Test Instruments Co., Ltd. After the background was measured in absence of a sample, the laminated film was set in a sample holder, and the measurement was conducted, and the total light transmission was determined.

A yellow index (YI) of a laminated film was measured by an ultraviolet-visible-near-infrared spectrophotometer V-670 available from JASCO Corporation. After the background was measured in absence of a sample, the laminated film was set in a sample holder, and the measurement was conducted, and tristimulus values (X,Y,Z) were determined. YI was calculated according to the following formula.

$$YI=100\times(1.28X-1.06Z)/Y$$

<X-Ray Photoelectron Spectrometry of Thin Film Layer Surface>

An atomic number ratio in a second thin film layer surface of a laminated film was measured by X-ray photoelectron spectroscopy (available from ULVAC PHI, Quantera SXM). An AlKα ray (1486.6 eV, X-ray spot 100 μm) was used as an X-ray source, and a neutralized electron gun (1 eV), and a low speed Ar ion gun (10 V) were used for charge correction at the time of measurement. Regarding analysis after the measurement, spectrum analysis was conducted by using MultiPak V6.1A (ULVAC-PHI, Inc.), and a surface atomic number ratio of C to Si was calculated by using peaks corresponding to binding energy of Si:2p, O:1s, N:1s, C:1s obtained from the measured wide scan spectrum. In the calculation of the surface atomic number ratio, an average value of five measurements was adopted.

Example 1

A biaxially-oriented polyethylene naphthalate film (Teonex Q65FA, available from Teijin DuPont Films Japan Limited, thickness 100 μm, width 350 mm, length 100 m) was used as a base material, and was mounted on a delivery roll inside a vacuum chamber. After the vacuum chamber was evacuated to $1\times10^{-3}$ Pa or less, a first thin film layer was deposited on the base material while the base material was conveyed at a constant speed of 0.5 m/min. The biaxially-oriented polyethylene naphthalate film used as the base material had an asymmetrical structure in which one surface was subjected to an easily-adhesive treatment, and the first thin film layer was deposited on a surface that was not subjected to the easily-adhesive treatment.

In a plasma CVD apparatus used for forming the first thin film layer, plasma is generated between a pair of electrodes, and the base material is conveyed while the base material is in close contact with surfaces of the electrodes, and a thin film layer is formed on the base material. In the pair of electrodes, magnets are disposed inside the electrodes such that a magnetic flux density is higher on the surfaces of the electrodes, and plasma is constrained at a high density on the electrodes at the time of generation of the plasma.

In the deposition of the first thin film layer, hexamethyldisiloxane gas was introduced at 55 sccm (Standard Cubic Centimeter per Minute, 0° C., 1 atmospheric pressure basis), and oxygen gas was introduced at 550 sccm toward a space between the electrodes which is to be a deposition zone, and AC electric power of 0.8 kW at a frequency of 70 kHz was supplied between electrode rolls to discharge electricity and generate plasma. Then the displacement was regulated such that a pressure in the vicinity of a vent in the vacuum chamber became 1 Pa, and subsequently the first thin film layer was formed on the conveyed base material by a plasma CVD method using glow discharge plasma. The thickness of the first thin film layer of a laminated film 1 was 200 nm.

Next, the laminated film 1 was mounted on a delivery roll disposed in another vacuum chamber, so as to make it possible to continuously convey the laminated film 1 to a winding roll through a thin film layer deposition zone. After the mounting of the laminated film 1, the vacuum chamber was evacuated to $1\times10^{-3}$ Pa or less, and subsequently a second thin film layer was deposited on the laminated film 1 while the laminated film 1 was conveyed at a constant speed of 0.1 m/min. The laminated film 1 was conveyed in such a manner that the conveyance direction of the laminated film 1 was parallel with one of two opposite sides of a rectangular dielectric window disposed above a second thin film layer deposition zone and was perpendicular to the other of the two opposite sides.

The second thin film layer was deposited on the laminated film 1 by a commonly used inductively-coupled plasma CVD method. In the deposition, monosilane gas was introduced at 100 sccm (Standard Cubic Centimeter per Minute, 0° C., 1 atmospheric pressure basis), ammonia gas was introduced at 500 sccm, and oxygen gas was introduced at 0.75 sccm into the deposition zone, and electric power of 1.0 kW at a frequency of 13.56 kHz was supplied to an induction coil to discharge electricity and generate plasma. Then, the displacement was regulated such that an internal pressure of the vacuum chamber became 1 Pa, and subsequently the second thin film layer was formed on the laminated film 1 by the inductively-coupled plasma CVD method using glow discharge plasma to obtain a laminated film 2. Subsequently, the interior of the vacuum chamber was recovered to the atmospheric pressure, and the laminated film 2 was removed, and subsequently, a surface of the second thin film layer was subjected to an atmospheric pressure plasma treatment by using an atmospheric pressure plasma surface treatment device (AP-T03-S440, available from SEKISUI CHEMICAL CO., LTD.), in a condition of an electric power of 130 V, a current of 4 A, and a speed of 20 m/min, to obtain a laminated film 3. The total thickness of the first and second thin film layers in the laminated film 3 was 1000 nm. The results of a thickness ratio of the first thin film layer, adhesiveness between the base material and the thin film layer, a gas barrier property and optical characteristics of the laminated film 3 are shown in Table 1. An atomic number ratio in a thin film layer surface of the laminated film 3 was 0.10.

Example 2

A laminated film 4 was obtained in the same manner as in Example 1 except that the thickness of a first thin film layer was 500 nm, and the total thickness of first and second thin film layers was 1000 nm instead of the thickness of the first thin film layer of 200 nm, and the total thickness of the first and second thin film layers of 1000 nm. The results of a thickness ratio of the first thin film layer, adhesiveness between the base material and the thin film layer, a gas barrier property and optical characteristics of the laminated film 4 are shown in Table 1. An atomic number ratio in a thin film layer surface of the laminated film 4 was 0.11.

Example 3

A laminated film 5 was obtained in the same manner as in Example 1 except that the thickness of a first thin film layer was 764 nm, and the total thickness of first and second thin film layers was 868 nm instead of the thickness of the first thin film layer of 200 nm, and the total thickness of the first and second thin film layers of 1000 nm. The results of a thickness ratio of the first thin film layer, adhesiveness between the base material and the thin film layer, a gas barrier property and optical characteristics of the laminated film 5 are shown in Table 1. An atomic number ratio in a thin film layer surface of the laminated film 5 was 0.10.

Comparative Example 1

A laminated film 6 was obtained in the same manner as in Example 1 except that the thickness of a first thin film layer was 980 nm, and a second thin film layer was not formed, instead of the thickness of the first thin film layer of 200 nm, and the total thickness of the first and second thin film layers of 1000 nm. The results of a thickness ratio of the first thin film layer, adhesiveness between the base material and the thin film layer, a gas barrier property and optical characteristics of the laminated film 6 are shown in Table 1.

Figure 2:
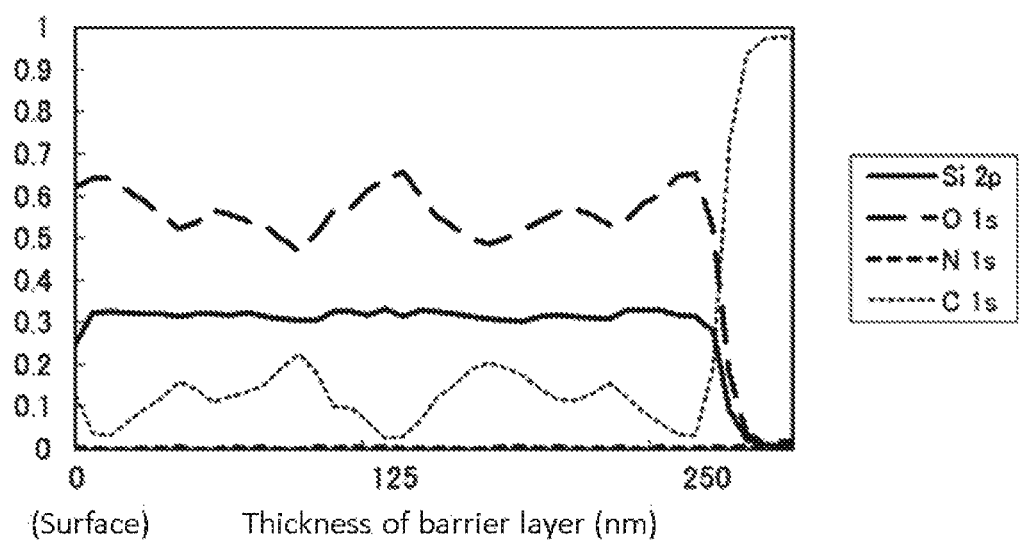
FIG. 2 is a graph showing a silicon distribution curve, an oxygen distribution curve, a nitrogen distribution curve and a carbon distribution curve of a first thin film layer in a laminated film 7 obtained in Comparative Example 1.

Further, a laminated film 7 was obtained in the same manner as in Example 1 except that the thickness of a first thin film layer was 250 nm, and a second thin film layer was not formed, instead of the thickness of the first thin film layer of 200 nm, and the total thickness of the first and second thin film layers of 1000 nm. The distance from a surface of the first thin film layer in the thickness direction of the first thin film layer, and distribution curves of a silicon atom, an oxygen atom, a nitrogen atom, and a carbon atom contained in the first thin film layer at a point situated at the distance are shown in FIG. 2. That is, FIG. 2 is a graph showing a silicon distribution curve, an oxygen distribution curve, a nitrogen distribution curve and a carbon distribution curve of the first thin film layer in the laminated film 7 obtained in Comparative Example 1.

Comparative Example 2

A laminated film 8 was obtained in the same manner as in Example 1 except that a first thin film layer was not formed, and a second thin film layer was formed directly on a base material by a thickness of 1000 nm, instead of the thickness of the first thin film layer of 200 nm, and the total thickness of the first and second thin film layers of 1000 nm. The results of a thickness ratio of the first thin film layer, adhesiveness between the base material and the thin film layer, a gas barrier property and optical characteristics of the laminated film 8 are shown in Table 1. An atomic number ratio (surface composition) in a thin film layer surface of the laminated film 8 was 0.11.

In the case where a cyclic cycloolefin film (for example, ZEONOR ZF16 film available from ZEON CORPORATION, thickness 100 μm, width 350 mm, length 100 m) was used as the base material in order to conduct infrared spectrometry for the second thin film layer of the laminated film 8, the second thin film layer was formed also by the same operation to obtain a laminated film 8'. The thickness and a configuration of a thin film layer in the laminated film 8' were the same as those in the laminated film 8.

Infrared spectrometry was conducted for the laminated film 8' in the following conditions.

<Infrared Spectrometry of Thin Film Layer>

Infrared spectrometry was conducted by a Fourier transformation type infrared spectrophotometer (FT/IR-460Plus, available from JASCO Corporation) equipped with an ATR attachment (PIKE MIRacle) using germanium crystals as a prism.

An absorption intensity ratio I'/I between a peak intensity (I) existing between 810 and 880 $cm^{-1}$ and a peak intensity (I') existing between 2100 and 2200 $cm^{-1}$ was determined from the obtained infrared absorption spectrum, and the result was I'/I=0.11.

Comparative Example 3

Figure 3:
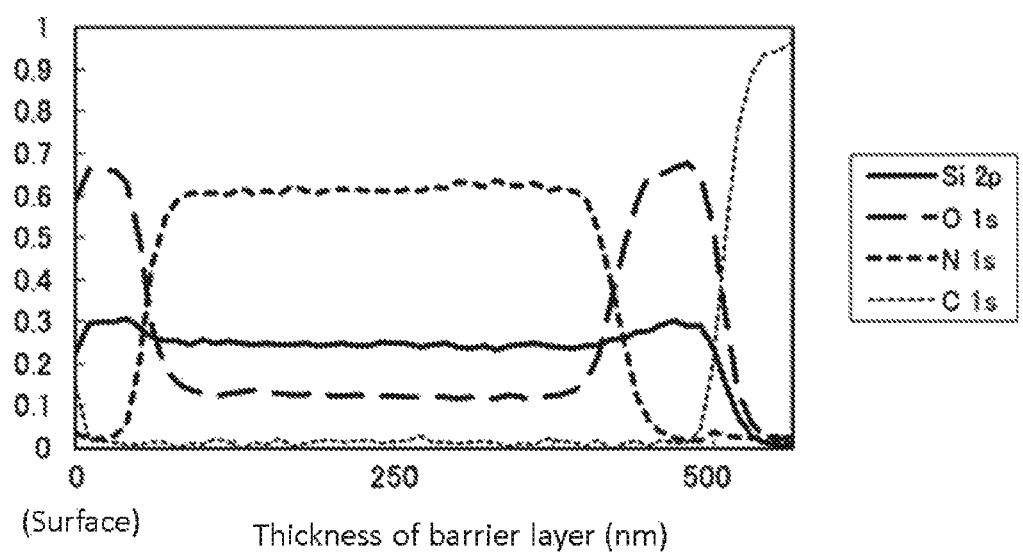
FIG. 3 is a graph showing a silicon distribution curve, an oxygen distribution curve, a nitrogen distribution curve and a carbon distribution curve of a second thin film layer in a laminated film 9 obtained in Comparative Example 3.

A laminated film 9 was obtained in the same manner as in Example 1 except that a first thin film layer was not formed, and a second thin film layer was formed directly on a base material by a thickness of 500 nm, instead of the thickness of the first thin film layer was 200 nm, and the total thickness of the first and second thin film layers was 1000 nm. The distance from a surface of the second thin film layer in the thickness direction of the second thin film layer, and distribution curves of a silicon atom, an oxygen atom, a nitrogen atom, and a carbon atom contained in the first thin film layer at a point situated at the distance are shown in FIG. 3. That is, FIG. 3 is a graph showing a silicon distribution curve, an oxygen distribution curve, a nitrogen distribution curve and a carbon distribution curve of the second thin film layer in the laminated film 9 obtained in Comparative Example 3. The result of FIG. 3 made it clear that N/Si≤0.2 was satisfied in the depth range up to 40 nm in the thickness direction toward inside the second thin film layer from the surface of the second thin film layer, and in the depth range up to 40 nm in the thickness direction toward inside the second thin film layer from an interface between the second thin film layer and the first thin film layer.

Evaluation was conducted for the thin film layer of the laminated film 9 by using spectroscopic ellipsometry (GRS-5 available from SOPRA). From the real part n of the complex refractive index at 550 nm, a refractive index was 1.75.

TABLE 1

|  | Thickness ratio T1/T | Adhesiveness between base material and thin film layer | Gas barrier property (g/m²/day) | Flexibility (%) | Total light transmission (%) | Yellow Index (YI) |
|---|---|---|---|---|---|---|
| Example 1 | 0.20 | ○ | 1 × 10⁻⁵ | 100 | 88 | 3.5 |
| Example 2 | 0.50 | ○ | 2 × 10⁻⁵ | 100 | 89 | 6.3 |
| Example 3 | 0.88 | ○ | 2 × 10⁻⁵ | 100 | 88 | 2.6 |
| Comparative Example 1 | 1.00 | ○ | 3 × 10⁻⁵ | 100 | 89 | 10.4 |
| Comparative Example 2 | 0 | X | 2 × 10⁻⁴ | 100 | 89 | 2.4 |

It was possible to confirm from these results that the laminated film according to the present invention maintains high optical characteristics such as a yellow index, a high gas barrier property such as water vapor permeability and high flexibility, and has excellent adhesiveness between the flexible base material and the thin film layer.

INDUSTRIAL APPLICABILITY

The present invention can be applied to a gas barrier film.

DESCRIPTION OF REFERENCE SIGNS

1 Inductively-coupled plasma CVD apparatus
2 Vacuum chamber
3 Induction coil, dielectric window
4 Vacuum pump (evacuation)
5 Matching box
6 High-frequency power source
7 Delivery roll
8 Winding roll
9 Base material
10 Gas introducing piping
11 Deposition part

The invention claimed is:

1. A laminated film comprising:
a flexible base material;
a first thin film layer formed directly on at least one of surfaces of the base material; and
a second thin film layer formed on the first thin film layer,
wherein the first thin film layer contains a silicon atom (Si), an oxygen atom (O) and a carbon atom (C), the second thin film layer contains a silicon atom, an oxygen atom and a nitrogen atom (N), and the first thin film layer and the second thin film layer are formed by using glow discharge plasma, wherein the flexible base material includes resin or a composite material containing resin, and wherein in a silicon distribution curve, an oxygen distribution curve, and a carbon distribution curve respectively showing a relationship between a distance from a surface of the first thin film layer in a thickness direction of the first thin film layer and a ratio of number of silicon atoms (atomic number ratio of silicon), a ratio of number of oxygen atoms (atomic number ratio of oxygen), and a ratio of number of carbon atoms (atomic number ratio of carbon), relative to a total number of the silicon atoms, the oxygen atoms and the carbon atoms contained in the first thin film layer at a point situated at the distance, the laminated film satisfies all of the following conditions (i) to (iii):
(i) the atomic number ratio of silicon, the atomic number ratio of oxygen and the atomic number ratio of carbon satisfy a condition represented by the following formula (1) in a region of 90% or more in the thickness direction of the first thin film layer:

(Atomic number ratio of oxygen)>(Atomic number ratio of silicon)>(Atomic number ratio of carbon)     (1)

(ii) the carbon distribution curve has at least one extreme, and
(iii) an absolute value of a difference between a maximum value and a minimum value of the atomic number ratio of carbon in the carbon distribution curve is 0.05 or more; and
wherein a thickness of the second thin film layer is 80 nm or more, and silicon atoms and oxygen atoms are contained in a depth range up to 40 nm in the thickness direction toward inside the second thin film layer from a surface of the second thin film layer, and an atomic number ratio of nitrogen atoms to silicon atoms within the depth range up to 40 nm in the thickness direction toward inside the second thin film layer from a surface of the second thin film layer is represented by the following formula (3):

$N/Si \leq 0.2$     (3), and wherein in the second thin film layer, an average atomic number ratio of the number of nitrogen atoms to the total number of silicon atoms, oxygen atoms, nitrogen atoms and carbon atoms falls within the range of 0.40 to 0.80.

2. The laminated film according to claim 1, wherein when X-ray photoelectron spectrometry is conducted for a surface of the second thin film layer, an atomic number ratio of carbon atoms to silicon atoms calculated from a wide scan spectrum falls within the range represented by the following formula (2):

$0 < C/Si \leq 0.2$     (2).

3. The laminated film according to claim 1, wherein a thickness of the second thin film layer is 80 nm or more, and silicon atoms and oxygen atoms are contained in a depth range up to 40 nm in the thickness direction toward inside the second thin film layer from an interface between the second thin film layer and the first thin film layer, and an atomic number ratio of nitrogen atoms to silicon atoms falls within the range represented by the following formula (4):

$N/Si \leq 0.2$     (4).

4. The laminated film according to claim 1, wherein when infrared spectrometry is conducted for the second thin film layer, an intensity ratio between a peak intensity (I) existing between 810 and 880 cm⁻¹ and a peak intensity (I') existing between 2100 and 2200 cm⁻¹ falls within the range represented by the following formula (5):

$0.05 \leq I'/I \leq 0.20$     (5).

5. The laminated film according to claim 1, wherein the first thin film layer and the second thin film layer are formed by a plasma CVD method.

6. The laminated film according to claim 1, wherein the second thin film layer is formed by an inductively-coupled plasma CVD method.

7. The laminated film according to claim 1, wherein the flexible base material comprises at least one selected from the group consisting of a primer coat layer and an undercoat layer.

8. The laminated film according to claim 1, wherein the flexible base material is in the form of a film or a sheet.

9. The laminated film according to claim 1, wherein the resin is selected from the group consisting of polyethylene terephthalate, polybutylene terephthalate, polyethylene naphthalate, acrylate, methacrylate, polycarbonate, polyarylate, polyethylene, polypropylene, cyclic polyolefin, polyamide, aromatic polyamide, polystyrene, polyvinyl alcohol, saponificated ethylene-vinyl acetate copolymer, polyacrylonitrile, polyacetal, polyimide, polyether imide, polyamide imide, polyether sulfide, and polyetheretherketone.

10. The laminated film according to claim 1, wherein the composite material is selected from the group consisting of silicone resin, organic-inorganic hybrid resin, glass composite, and glass epoxy.

11. The laminated film according to claim 10, wherein the composite material is silicone resin.

12. The laminated film according to claim 11, wherein the silicone resin is polydimethylsiloxane.

13. The laminated film according to claim 10, wherein the composite material is organic-inorganic hybrid resin.

14. The laminated film according to claim 13, wherein the organic-inorganic hybrid resin is polysilsesquioxane.

15. A flexible electronic device using the laminated film according to claim 1 as a substrate.

* * * * *